United States Patent
Malinen et al.

(10) Patent No.: US 9,745,661 B2
(45) Date of Patent: Aug. 29, 2017

(54) METHOD AND APPARATUS FOR FORMING A SUBSTRATE WEB TRACK IN AN ATOMIC LAYER DEPOSITION REACTOR

(71) Applicant: Picosun Oy, Espoo (FI)

(72) Inventors: Timo Malinen, Espoo (FI); Väinö Kilpi, Espoo (FI)

(73) Assignee: Picosun Oy, Espoo (FI)

( * ) Notice: Subject to any disclaimer, the term of this patent is extended or adjusted under 35 U.S.C. 154(b) by 0 days.

(21) Appl. No.: 14/899,952

(22) PCT Filed: Jun. 27, 2013

(86) PCT No.: PCT/FI2013/050713
§ 371 (c)(1),
(2) Date: Dec. 18, 2015

(87) PCT Pub. No.: WO2014/207289
PCT Pub. Date: Dec. 31, 2014

(65) Prior Publication Data
US 2016/0138163 A1    May 19, 2016

(51) Int. Cl.
*C23C 16/54* (2006.01)
*C23C 16/455* (2006.01)
*C23C 16/458* (2006.01)

(52) U.S. Cl.
CPC .......... *C23C 16/545* (2013.01); *C23C 16/458* (2013.01); *C23C 16/45544* (2013.01)

(58) Field of Classification Search
CPC ........ C23C 16/45523; C23C 16/45525; C23C 16/4584; C23C 16/54; C23C 16/545
See application file for complete search history.

(56) References Cited

U.S. PATENT DOCUMENTS

| | | | |
|---|---|---|---|
| 3,453,847 A | 7/1969 | Romanauskas | |
| 8,137,464 B2 * | 3/2012 | Dickey | C23C 16/545 118/718 |
| 8,304,019 B1 * | 11/2012 | Pichler | C23C 16/02 118/718 |
| 2003/0121469 A1 | 7/2003 | Lindfors et al. | |
| 2007/0224348 A1 * | 9/2007 | Dickey | C23C 16/545 427/248.1 |

(Continued)

FOREIGN PATENT DOCUMENTS

EP     0395029 A2    10/1990
EP     1964943 A1    9/2008
(Continued)

OTHER PUBLICATIONS

Tan, Lee Kheng, et al., "Sub-100 nm features seamless roller mold using anodization and atomic layer deposition, for roll-to-roll nanoimprint lithography". J. Vac. Sci. Technol. B 34(5), Sep./Oct. 2016, pp. 051601-1 to 051601-5.*

(Continued)

*Primary Examiner* — Bret Chen
(74) *Attorney, Agent, or Firm* — Ziegler IP Law Group, LLC

(57) ABSTRACT

An apparatus and method for forming a substrate web track with a repeating pattern into a reaction space of a deposition reactor by moving a first set of support rolls in relation to a second set of support rolls.

11 Claims, 4 Drawing Sheets

(56) References Cited

U.S. PATENT DOCUMENTS

| | | | | |
|---|---|---|---|---|
| 2007/0281089 | A1* | 12/2007 | Heller | C23C 16/45514 427/255.5 |
| 2009/0305449 | A1* | 12/2009 | Bollman | B32B 15/01 438/57 |
| 2011/0076421 | A1 | 3/2011 | Lee | |
| 2012/0141676 | A1* | 6/2012 | Sershen | C23C 16/45551 427/255.23 |
| 2014/0318456 | A1* | 10/2014 | Shin | C23C 16/4583 118/725 |
| 2015/0083043 | A1* | 3/2015 | Sasaki | B05B 13/0221 118/500 |
| 2015/0107510 | A1* | 4/2015 | Lindfors | C23C 16/45544 117/98 |
| 2015/0167165 | A1* | 6/2015 | Lindfors | C23C 16/403 427/255.23 |
| 2016/0024655 | A1* | 1/2016 | Yudovsky | H01L 21/67126 118/730 |

FOREIGN PATENT DOCUMENTS

| | | |
|---|---|---|
| JP | 2009540128 A | 11/2009 |
| JP | 2013067832 A | 4/2013 |
| RU | 2082819 C1 | 6/1997 |
| RU | 2335577 C2 | 10/2008 |
| WO | 2007145513 A1 | 12/2007 |
| WO | 2013186426 A1 | 12/2013 |
| WO | 2013186427 A1 | 12/2013 |

OTHER PUBLICATIONS

Barrow, W.A., et al., "Roll-to-roll ALD deposition of Al2O3 barrier layers on PET". Proc. AIMCAL Fall Tech Conf. 23rd Internat. Vac. Web Coating Conf. 2009, pp. 1-7.*

Jiang, Liang-Ting, et al., "Direct fabrication of rigid microstructures on a metallic roller using a dry film resist". J. Micromech. Microeng, 18 (2008) 015004, pp. 1-6.*

International Search Report and Written Opinion of International Searching Authority for PCT No. PCT/FI2013/050713, mailed Oct. 2, 2014, 15 pages.

Notification of ground of rejection, Application No. 2016-522673, mailed Feb. 20, 2017, 5 pages.

Extended European Search Report, Application No. 13888461.4-1373/3013998 PCT/FI2013/050713, mailed Jan. 31, 2017, 8 pages.

Federal Service for Intellectual Property, Office Action, Application No. 2015155191102(085136), dated May 30, 2017, 10 pages.

* cited by examiner

METHOD AND APPARATUS FOR FORMING A SUBSTRATE WEB TRACK IN AN ATOMIC LAYER DEPOSITION REACTOR

FIELD OF THE INVENTION

The present invention generally relates to deposition reactors. More particularly, the invention relates to providing a substrate web track with a repeating pattern into a reaction vessel in a deposition reactor.

BACKGROUND OF THE INVENTION

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to at least one substrate.

Thin films grown by ALD are dense, pinhole free and have uniform thickness. For example, in an experiment aluminum oxide has been grown by thermal ALD from trimethylaluminum $(CH_3)_3Al$, also referred to as TMA, and water resulting in only about 1% non-uniformity over a substrate wafer.

One interesting application of ALD technique is to provide coatings on a moving substrate web.

SUMMARY

According to a first example aspect of the invention there is provided a method comprising:

forming a substrate web track with a repeating pattern into a reaction vessel of an atomic layer deposition reactor by moving a first set of support rolls in relation to a second set of support rolls; and supporting the substrate web by the first and second sets of support rolls when the track has been formed.

In certain example embodiments, the reaction vessel is a reaction chamber. In certain example embodiments, the reaction chamber is surrounded by a vacuum chamber (the vacuum chamber houses the reaction chamber). In certain example embodiments, the reaction vessel is a reaction chamber inside an in-line atomic layer deposition module.

In certain example embodiments, the method comprises moving the first set of support rolls from a first side of the second set of support rolls to the other side of the second set of support rolls. By the term roll is here meant both ordinary rolls and wheels as well as other equivalent mechanical means for turning and supporting a substrate web.

In certain example embodiments, the method comprises forming inside the reaction vessel a three-dimensional atomic layer deposition flow volume defined by a reaction vessel lid, reaction vessel sidewalls and the formed substrate web track. In this way, the area of surfaces that need cleaning after processing can be reduced, being in an example embodiment basically only the reaction vessel sidewalls and lid.

The deposition reactor may be an ALD reactor. In certain example embodiments, the deposition reactor comprises a reaction chamber providing a reaction space. The reaction chamber can be closed by a lid. In certain example embodiments, the first set of support rolls is attached to a chamber lid. The first set of support rolls can be attached to the chamber lid, for example, by at least one support stem. The at least one support stem can be stationary or deformable. The movement of the first set of rolls can be effected, for example, by deforming the at least one stem (the at least one stem can have a nested structure or similar), by moving the at least one stem via a feedthrough arranged in the chamber lid, or the movement can be effected by a movement of the chamber lid itself.

In certain example embodiments, precursor vapor is fed into the reaction chamber (or vessel) through the reaction chamber (or vessel) lid.

In certain example embodiments, the reaction chamber is surrounded by a vacuum chamber. In certain example embodiments, inactive gas is fed into the vacuum chamber to obtain an overpressure in relation to the reaction chamber. The reactor in certain example embodiments comprises an inactive gas in-feed line into the vacuum chamber.

In certain example embodiments, the first set of support rolls are attached to a counterpart in a roof or wall of a reaction chamber, or alternatively in a roof or wall of a reaction unit or module forming the reaction space. Depending on the implementation, the reaction unit or module can reside within a reaction chamber. The movement of the first set of rolls can be effected, for example, by moving the counterpart in the roof or wall to which the first set of support rolls is attached. The movement can be driven by an actuator external to the reaction chamber, or external to the reaction space.

In certain example embodiments, the substrate web is loaded into the reaction chamber from the top of the reaction chamber supported by the first set of rolls.

In certain example embodiments, the method comprises forming a track of a pleated form by pushing the substrate web by the first set of support rolls to the other side of the second set of the support rolls. The movement of the first set of rolls may be translational motion.

In certain example embodiments, the method comprises removing gases from the reaction space, during deposition, via a route travelling through the first set of support rolls.

The rolls of the first set of rolls may be partially open at the ends and on the sides of the rolls. The rolls may have a roll axis that is thinner than the outer diameter of the rolls. The rolls may be implemented by wheels that are spatially separated from each other. They may have a common rotation axis formed by the roll axis.

In certain example embodiments, a substrate web source roll is integrated into a chamber lid of the deposition reactor. The chamber lid is a movable lid. The substrate web source roll may be integrated on the other side of the lid compared to the side on which the reaction space resides.

In certain example embodiments, the substrate web is fed into a reaction chamber or reaction space through a chamber lid.

The chamber lid mentioned may be a lid closing the reaction chamber. The lid is may be dual-lid system comprising a reaction chamber lid integrated to a vacuum chamber lid.

According to a second example aspect of the invention there is provided an atomic layer deposition reactor, comprising:

a reaction vessel configured to provide a reaction space;
a first set of support rolls; and
a second set of support rolls, wherein
the first and second sets of support rolls are configured to form a substrate web track with a repeating pattern into the reaction vessel by moving the first set of support rolls in relation to the second set of support rolls; and the first and second sets of support rolls are configured to support the substrate web when the track has been formed.

The reaction space is the volume in which the deposition reactions of the deposition reactor occur. The reaction chamber may practically be the same volume as the reaction space or the reaction chamber may be configured to provide the reaction space within the reaction chamber by defining a smaller volume within the reaction chamber or by accommodating a smaller unit or module (reaction vessel) within the reaction chamber.

In certain example embodiments, the deposition reactor comprises a mechanism configured to move the first set of support rolls from a first side of the second set of support rolls to the other side of the second set of support rolls.

In certain example embodiments, the first and second sets of support rolls are configured to form a track of a pleated form by pushing the substrate web by the first set of support rolls to the other side of the second set of the support rolls.

In certain example embodiments, the deposition reactor is configured to remove gases from the reaction space, during deposition, via a route travelling through the first set of support rolls.

In certain example embodiments, the deposition reactor is configured to form inside the reaction vessel a three-dimensional atomic layer deposition flow volume defined by a reaction vessel lid, reaction vessel sidewalls and the formed substrate web track.

In certain example embodiments, a substrate web source roll is integrated into a chamber lid of the deposition reactor.

In certain example embodiments, a chamber lid of the deposition reactor comprises a feedthrough configured feed the substrate web into the reaction chamber or reaction space through the chamber lid.

In certain example embodiments, the reaction chamber lid (or vessel lid) comprises a channel configured to feed precursor vapor into the reaction chamber (or vessel) through the reaction chamber lid (or vessel lid).

Different non-binding example aspects and embodiments of the present invention have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well. Any appropriate combinations of the embodiments may be formed.

BRIEF DESCRIPTION OF THE DRAWINGS

The invention will now be described, by way of example only, with reference to the accompanying drawings, in which.

DETAILED DESCRIPTION

In the following description, Atomic Layer Deposition (ALD) technology is used as an example. The basics of an ALD growth mechanism are known to a skilled person. As mentioned in the introductory portion of this patent application, ALD is a special chemical deposition method based on the sequential introduction of at least two reactive precursor species to at least one substrate. The at least one substrate is exposed to temporally separated precursor pulses in the reaction chamber to deposit material on the substrate surfaces by sequential self-saturating surface reactions. In the context of this application, the term ALD comprises all applicable ALD based techniques and any equivalent or closely related technologies, such as, for example MLD (Molecular Layer Deposition) and PEALD (Plasma Enhanced Atomic Layer Deposition) techniques.

A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be more complex. For example, the cycles can include three or more reactant vapor pulses separated by purging steps. All these deposition cycles form a timed deposition sequence that is controlled by a logic unit or a microprocessor.

Figure 1:
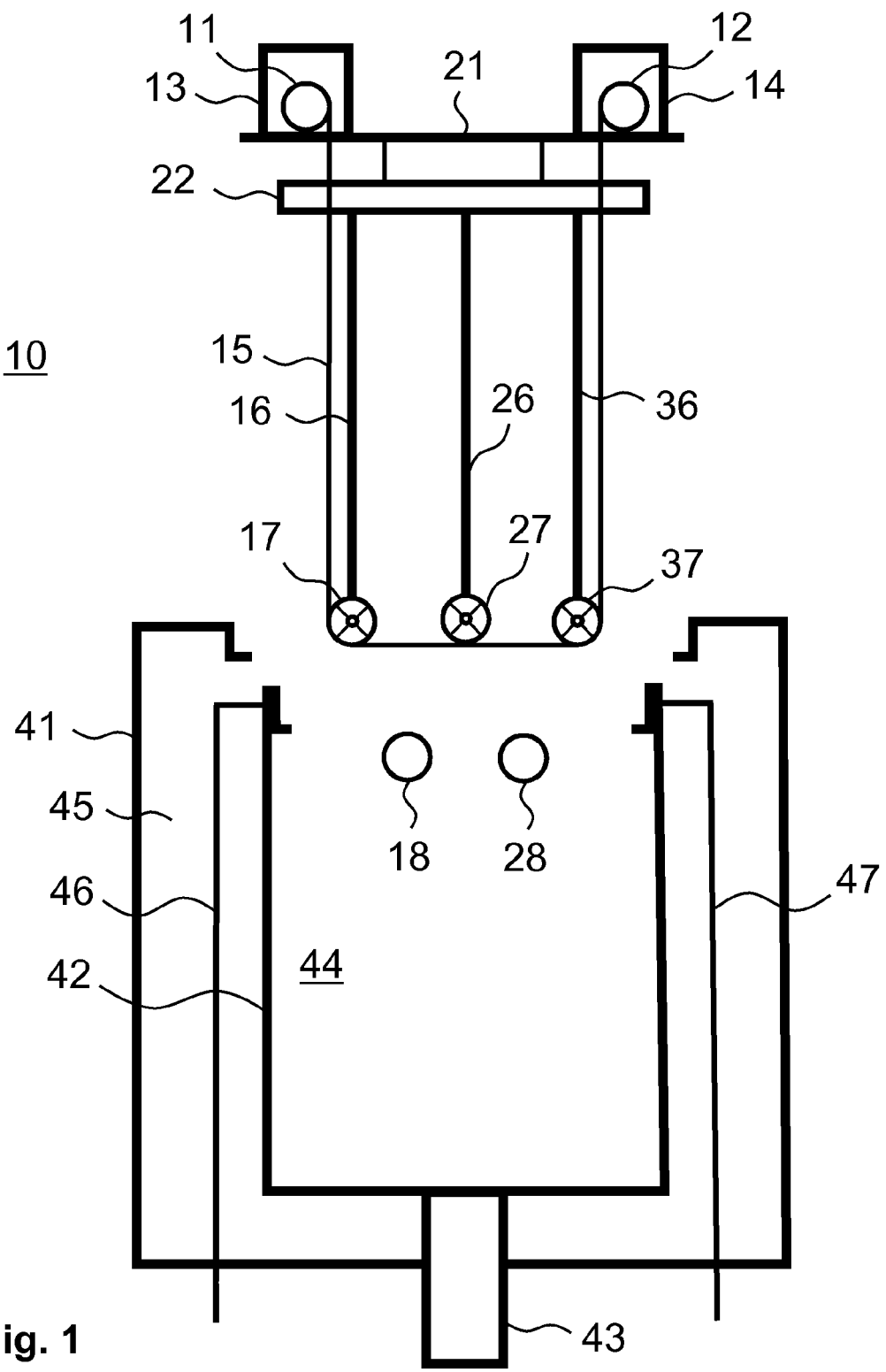
FIGS. 1 and 2 show a schematic view of a deposition reactor and automatic forming of a substrate web track in the deposition reactor in accordance with an example embodiment.

In certain example embodiments as described in the following, there is provided a method and apparatus for forming a substrate web track with a repeating pattern into a reaction space of a deposition reactor. FIG. 1 shows such a deposition reactor (deposition reactor 10). The deposition reactor 10 comprises a vacuum chamber wall 41 forming a vacuum chamber 45. Within the vacuum chamber 45, and surrounded by the vacuum chamber 45, the deposition reactor 10 comprises a reaction chamber (or vessel) 44. The reaction chamber 44 is defined by a reaction chamber wall 42. The vacuum chamber 45 and the reaction chamber 44 are closed by a chamber lid, which in FIG. 1 is in its upper position (i.e., initial position for loading a substrate web). In the example shown in FIG. 1 the chamber lid is a dual-lid system comprising a vacuum chamber lid 21 that is integrated with a reaction chamber lid 22.

In the embodiment shown in FIG. 1, a substrate web 15 is loaded into the reaction chamber 44 from the top side of the reaction chamber 44. A substrate web source roll 11 is integrated to the chamber lid. In the event of the dual-lid system, the source roll 11 is integrated either to the reaction chamber lid 22 or, as shown in FIG. 1, to the vacuum chamber lid 21. The substrate web source roll 11 may then reside on the other side of the chamber lid (or respective lid) than the reaction chamber 44. The substrate web source roll 11 may reside in a housing 13 integrated to the chamber lid (or respective lid).

The chamber lid comprises a feedthrough through which the substrate web 15 on the source roll 11 travels from one side of the lid to the other side of the lid. In the event the chamber lid is a dual-lid system, there may be a feedthrough through both lids 21 and 22 depending on the implementation. On the reaction chamber side of the chamber lid, the route of the substrate web extends substantially vertically downwards. The vertically extending route turns at a first edge roll 17 of a first set of support rolls. The route continues in a substantially horizontal direction passing a center roll 27 of the first set of support rolls (in other embodiments, there may be zero or more than one center/intermediate roll). The horizontally extending route, in turn, turns at a second edge roll 37 of the first set of support rolls upwards, and extends substantially vertically upwards until it reaches the chamber lid.

A substrate web destination roll 12 is integrated to the chamber lid. In the event of the dual-lid system, the destination roll 12 is integrated either to the reaction chamber lid 22 or, as shown in FIG. 1, to the vacuum chamber lid 21. The substrate web destination roll 12 may then reside on the other side of the chamber lid (or respective lid) than the reaction chamber 44. The substrate web destination roll 12 may reside in a housing 14 integrated to the chamber lid (or respective lid). Inactive gas may be fed into the housing 14 as well as housing 13 during deposition.

The chamber lid comprises a feedthrough through which the substrate web 15 travels from one side of the lid to the other side of the lid and is finally wound up onto the destination roll 12. In the event the chamber lid is a dual-lid system, there may be a feedthrough through both lids 21 and 22 depending on the implementation.

The first set of support rolls are integrated to the chamber lid by respective support stems 16, 26 and 36. There may be one or more support stems depending on the implementation.

In the event of the dual-lid system, the at least one support stem may be attached to the reaction chamber lid 22. Alternatively, the at least one support stem may be attached to the vacuum chamber lid 21, or to both lids. In yet an alternative, the at least one support stem may merely go through the reaction chamber lid 22 at a feedthrough and be attached to the vacuum chamber lid 21. In yet an alternative, the at least one support stem go through the whole chamber lid or lid system by feedtrough(s), and is attached to a support point on the outside of the reaction chamber or on the outside of the vacuum chamber. In all of these embodiments, the at least one support stem or similar is considered to be integrated to the chamber lid (or to the reaction chamber lid).

The deposition reactor 10 comprises a second set of support rolls in the reaction chamber 44. The rolls of the second set may be rotatable mounted, for example, to the reaction chamber wall 42. The rolls of the second set of support rolls can consist of at least one roll. Preferable, the second set of support rolls comprises at least two rolls. If there are more than two rolls, the second set comprises both edge rolls and intermediate rolls. In FIG. 1 there are shown a first edge roll 18 and a second edge roll 28 of the second set of support rolls. As mentioned, there may be one or more intermediate rolls depending on the implementation. The second set of support rolls may be placed on a row, i.e., the rolls of the second set may be placed on the same level with respect to the other rolls belonging to the second set.

The deposition reactor 10 is a reactor that is loadable from the top side of the reactor. The deposition reactor comprises the chamber lid on the top side of the reaction chamber 44 and an exhaust line 43 at the bottom side of the reaction chamber 44. The deposition reactor 10 further comprises the required precursor vapor in-feed lines and purge gas in-feed lines (denoted by reference numerals 46 and 47 in FIG. 1) for feeding precursor vapor and purge gas into the reaction chamber 44 in accordance with ALD technology. The precursor vapor may be fed into the reaction chamber through the reaction chamber lid 22.

Figure 2:
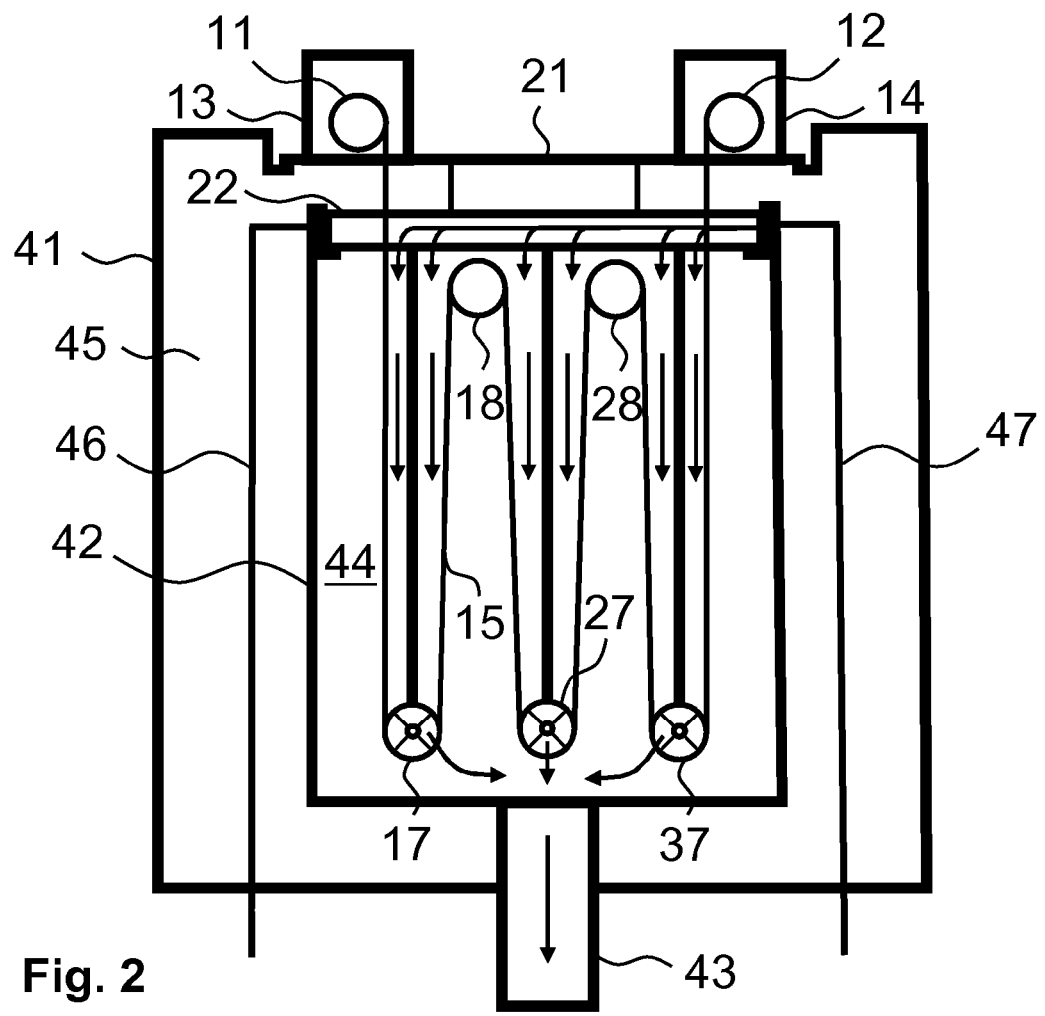

A substrate web track with a repeating pattern as shown in FIG. 2 is formed by moving the first set of support rolls in relation to the second set of support rolls. In practice this can be achieved, for example, by lowering the chamber lid from its upper (initial) position into its lower position. The first set of support rolls 17-37 moving from a first side (here: upper side) of the second set of support rolls 18-28 to the other side (here: lower side) of the second set of support rolls cause the desired track formation. In the end position as shown in FIG. 2 the substrate web is supported by both the first and second sets of support rolls and a track of a pleated form has been formed. The rolls that in the initial state form upper rolls (i.e., the first set of support rolls) become by the track formation the lower rolls as shown in FIG. 2.

The first set of support rolls can be moved by a mechanism, such as the at least one support stem shown in FIGS. 1 and 2. The at least one support stem can be stationary or deformable with respect to the chamber lid. The movement of the first set of rolls can be effected, for example, by a movement of the chamber lid itself (as shown in FIGS. 1 and 2). Alternatively, or in addition, the movement of the first set of rolls can be effected, for example, by deforming the at least one stem (the at least one stem can have a nested structure or similar) and/or by moving the at least one stem via a feedthrough arranged in the chamber lid (or reaction chamber lid).

The in-feed lines 46 and 47 in the embodiment shown in FIG. 1 travel through the vacuum chamber wall 41 and face the reaction chamber 44 at its top section. In the example embodiment of FIG. 1, the precursor vapor and purge gas enter the reaction chamber 44 from the top. They may flow through the reaction chamber lid 22. The pleated form of the track together with the reaction chamber (side) wall 42 and the reaction chamber lid 22 form a partially closed space, the reaction space. The side of the substrate web facing the reaction space is coated by sequential self-saturating surface reactions in accordance with the ALD technology. The arrows drawn within the reaction space in FIG. 2 show the direction of flow within the reaction space. The precursor vapor and purge gas flow as a top-to-bottom flow along the substrate web surface in pockets of the pleated form.

In certain example embodiments, the method comprises removing gases from the reaction space, during deposition, via a route travelling through the first set of support rolls. The rolls 17-37 of the first set of rolls may be partially open at the ends and on the sides of the rolls. The gases exit the reaction space via the open ends of the rolls 17-37 to the exhaust line 43 as shown by the arrows in FIG. 2.

Figure 3:
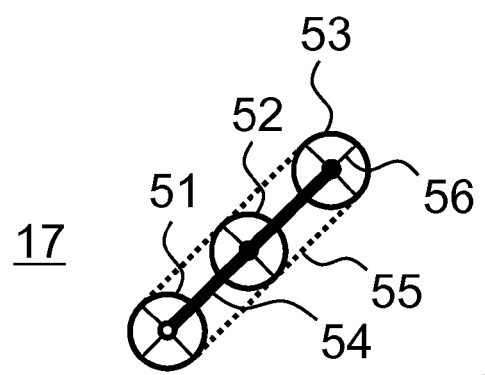
FIG. 3 shows a structure of a support roll in accordance with an example embodiment.

FIG. 3 shows the structure of a roll (for example, roll 17) belonging to the first set of support rolls in accordance with an example embodiment. The roll 17 comprises wheels 51, 52 and 53 which are connected to a common roll axis 54 by a set of spokes 56 or similar. The roll axis 54 is thinner than the diameter of the wheels 51-53. The roll 17 is open on the side of the roll and at the ends of the roll. The roll may optionally comprise a perforated mantle 55 around it. The structure of the roll 17 is thereby such that it allows gases to flow through it and to exit via its ends.

Figure 4:
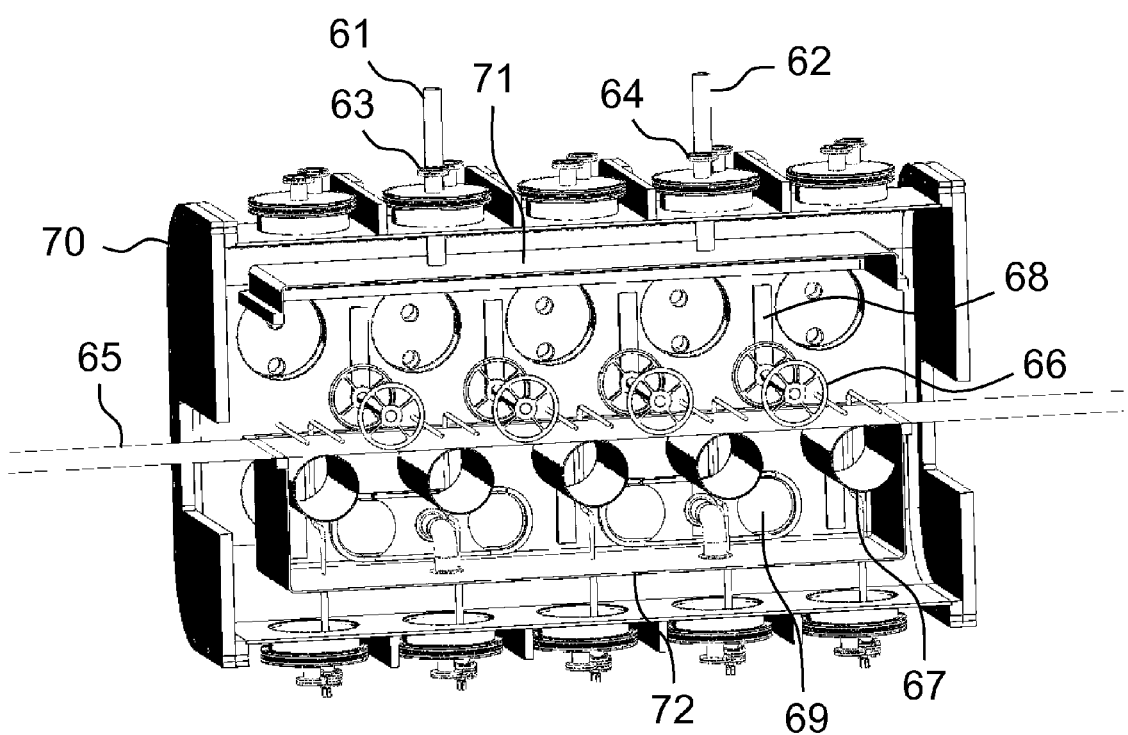
FIGS. 4 and 5 show a schematic view of a module for forming a reaction space and automatic forming of a substrate web track in the module in accordance with an example embodiment.
Figure 5:
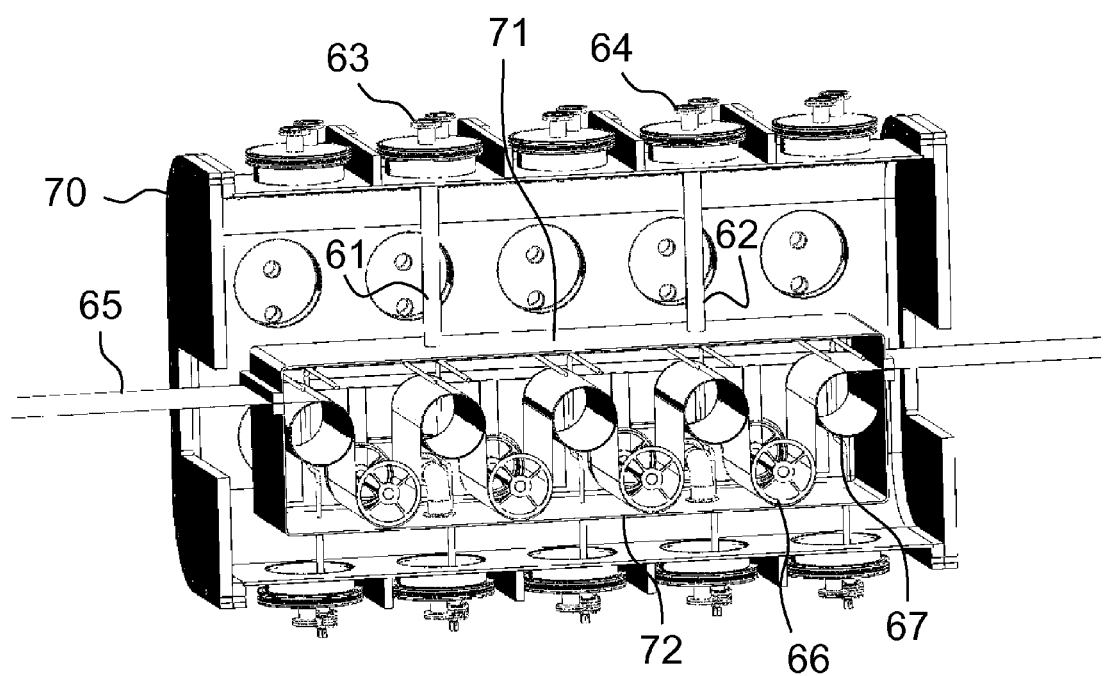

FIGS. 4 and 5 show a schematic view of an ALD module 70 designed for an in-line solution, i.e., for forming a part of a production line. The module 70 of comprises an input slot and an output slot for a substrate web 65 at its opposite sides. A reaction chamber (vessel) is formed by a body part 72 and a lid part (or roof) 71 within the module 70. The lid part 71 is vertically movable by support stems 61 and 62 that are attached thereto. The support stems 61 and 62 extend through the roof of the module 70 at feedthroughs 63 and 64, respectively. The vertical movement can be driven by an external actuator (not shown).

The module 70 comprises a first set of substrate web support rolls 66 and a second set of substrate web support rolls 67 similarly as described in the foregoing embodiments. A general reference is made to the foregoing embodiments as to the structure and operation of the support rolls. The second set of rolls 67 is stationary while the first set of rolls 66 can be moved. A movement mechanism 68 for moving the first set of rolls 66 is attached to the reaction chamber wall (as shown in FIG. 4). The movement mechanism 68 may also be connected to the reaction chamber lid part 71 so that when the reaction chamber lid part 71 is moved vertically by the external actuator, the first set of rolls 66 move together with it.

A substrate web track with a repeating pattern as shown in FIG. 5 is formed by moving the first set of support rolls 66 in relation to the second set of support rolls 67. This is, again, achieved by lowering the chamber lid part 71 from its upper (initial) position into its lower position. The first set of support rolls 66 moving from an upper side of the second set of support rolls 67 to the lower side of the second set of support rolls cause the desired track formation. In the end position as shown in FIG. 5 the substrate web is supported by both the first and second sets of support rolls and a track of a pleated form has been formed.

The reaction chamber further comprises an apertures 69 at the point to which the first set of support rolls 66 move by the vertical movement so that gases can exit via the ends of first set of support rolls 66 similarly as in the foregoing embodiments.

The precursor vapor may be fed into the reaction vessel from the top through (one or more channels in) the reaction vessel lid part 71. In certain example embodiments, the precursor vapor is fed via a channel formed inside at least one support stem 61 and/or 62. The module forms inside the reaction vessel a three-dimensional atomic layer deposition flow volume defined by the reaction vessel lid part 71, reaction vessel sidewalls and the formed substrate web track.

Without limiting the scope and interpretation of the patent claims, certain technical effects of one or more of the example embodiments disclosed herein are listed in the following: A technical effect is automatic track formation by moving a first set of support rolls in relation to a second set of support rolls. Another technical effect is achieving a top-to-bottom flow by removing gases from the reaction space via a route travelling through the first (i.e., lower) set of support rolls.

It should be noted the some of the functions or method steps discussed in the preceding may be performed in a different order and/or concurrently with each other. Furthermore, one or more of the above-described functions or method steps may be optional or may be combined.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A method comprising:
    forming a substrate web track with a repeating pattern into a reaction vessel of an atomic layer deposition reactor by moving a first set of support rolls from a first side of a second set of support rolls to another side of the second set of support rolls; and
    supporting the substrate web by the first and second sets of support rolls when the track has been formed.

2. The method of claim 1, comprising forming a track of a pleated form by pushing the substrate web by the first set of support rolls to the other side of the second set of the support rolls.

3. The method of claim 1, comprising forming inside the reaction vessel a three-dimensional atomic layer deposition flow volume defined by a reaction vessel lid, reaction vessel sidewalls and the formed substrate web track.

4. The method of claim 1, comprising removing gases from the reaction space, during deposition, via a route travelling through the first set of support rolls.

5. The method of claim 1, wherein a substrate web source roll is integrated into a chamber lid of the deposition reactor.

6. The method of claim 1, wherein the substrate web is fed into a reaction chamber or reaction space through a reaction chamber lid.

7. An atomic layer deposition reactor, comprising:
    a reaction vessel configured to provide a reaction space;
    a first set of support rolls;
    a second set of support rolls, wherein
        the first and second sets of support rolls are configured to form a substrate web track with a repeating pattern into the reaction vessel by moving the first set of support rolls in relation to the second set of support rolls; and the first and second sets of support rolls are configured to support the substrate web when the track has been formed;
    the deposition reactor further comprising a mechanism configured to move the first set of support rolls from a first side of the second set of support rolls to another side of the second set of support rolls.

8. The deposition reactor of claim 7, wherein the first and second sets of support rolls are configured to form a track of a pleated form by pushing the substrate web by the first set of support rolls to the other side of the second set of the support rolls.

9. The deposition reactor of claim 7, wherein deposition reactor is configured to remove gases from the reaction space, during deposition, via a route travelling through the first set of support rolls.

10. The deposition reactor of claim 7, wherein a substrate web source roll is integrated into a chamber lid of the deposition reactor.

11. The deposition reactor of claim 7, wherein a chamber lid of the deposition reactor comprises a feedthrough configured to feed the substrate web into the reaction chamber or reaction space through the chamber lid.

* * * * *